United States Patent
Zhang et al.

(10) Patent No.: US 9,034,684 B2
(45) Date of Patent: May 19, 2015

(54) TEXTURING SURFACE OF LIGHT-ABSORBING SUBSTRATE

(75) Inventors: Jun-Ying Zhang, Woodbury, MN (US); Terry L. Smith, Roseville, MN (US); Bing Hao, Woodbury, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 189 days.

(21) Appl. No.: 13/509,504

(22) PCT Filed: Nov. 8, 2010

(86) PCT No.: PCT/US2010/055772
§ 371 (c)(1), (2), (4) Date: May 11, 2012

(87) PCT Pub. No.: WO2011/062791
PCT Pub. Date: May 26, 2011

(65) Prior Publication Data
US 2012/0225517 A1     Sep. 6, 2012

Related U.S. Application Data

(60) Provisional application No. 61/261,875, filed on Nov. 17, 2009.

(51) Int. Cl.
*H01L 31/0236* (2006.01)

(52) U.S. Cl.
CPC ........... *H01L 31/02366* (2013.01); *Y02E 10/50* (2013.01)

(58) Field of Classification Search
CPC .............. H01L 31/0236; H01L 27/14627; H01L 27/14685; H01L 31/0527; Y02E 10/50
USPC .............................................. 438/71
See application file for complete search history.

(56) References Cited

U.S. PATENT DOCUMENTS

| | | | | |
|---|---|---|---|---|
| 4,407,695 A * | 10/1983 | Deckman et al. | | 216/42 |
| 5,510,156 A * | 4/1996 | Zhao | | 427/534 |
| 5,676,853 A * | 10/1997 | Alwan | | 216/11 |
| 6,037,104 A * | 3/2000 | Lahaug | | 430/314 |
| 6,338,938 B1 * | 1/2002 | Lahaug | | 430/314 |
| 6,372,404 B1 * | 4/2002 | Wells et al. | | 430/270.1 |
| 6,372,405 B1 * | 4/2002 | Wells et al. | | 430/270.1 |
| 6,428,943 B1 * | 8/2002 | Wells et al. | | 430/313 |
| 6,495,296 B1 * | 12/2002 | Wells et al. | | 430/5 |
| 6,521,541 B2 * | 2/2003 | Rossi | | 438/710 |
| 6,579,463 B1 * | 6/2003 | Winningham et al. | | 216/41 |
| 6,723,606 B2 * | 4/2004 | Flagan et al. | | 438/264 |

(Continued)

FOREIGN PATENT DOCUMENTS

| JP | 2008-091880 | 4/2008 |
|---|---|---|
| WO | WO 2004/061980 A1 | 7/2004 |

OTHER PUBLICATIONS

Bent et al., Inorganic Nano Composite Solar Cells by Atomic Layer Deposition (ALD), GCEP Technical Report, 2006, pp. 1-10.*

(Continued)

*Primary Examiner* — Earl Taylor
(74) *Attorney, Agent, or Firm* — Yufeng Dong; Kristofor L. Storvick

(57) ABSTRACT

Etched substrates, and particularly, light-absorbing etched substrates, and methods for making such substrates are described.

18 Claims, 7 Drawing Sheets

(56) References Cited

U.S. PATENT DOCUMENTS

| | | | |
|---|---|---|---|
| 6,984,842 B1* | 1/2006 | Nayfeh et al. | 257/14 |
| 7,033,936 B1* | 4/2006 | Green | 438/669 |
| 7,115,208 B2* | 10/2006 | Hieda et al. | 216/22 |
| 7,306,743 B2* | 12/2007 | Hieda et al. | 216/22 |
| 7,385,231 B2* | 6/2008 | Fujimoto et al. | 257/121 |
| 7,482,619 B2* | 1/2009 | Seol et al. | 257/24 |
| 7,790,560 B2* | 9/2010 | Das | 438/287 |
| 8,039,292 B2* | 10/2011 | Guha et al. | 438/98 |
| 8,120,132 B2* | 2/2012 | Guha et al. | 257/459 |
| 2002/0023894 A1* | 2/2002 | Rossi | 216/2 |
| 2004/0110347 A1* | 6/2004 | Yamashita | 438/286 |
| 2006/0131261 A1* | 6/2006 | Green | 216/17 |
| 2006/0163646 A1* | 7/2006 | Black et al. | 257/316 |
| 2006/0263642 A1* | 11/2006 | Hieda et al. | 428/826 |
| 2007/0049047 A1* | 3/2007 | Fujimoto et al. | 438/759 |
| 2007/0064468 A1* | 3/2007 | Seol et al. | 365/129 |
| 2009/0114944 A1 | 5/2009 | Ono et al. | |
| 2009/0121272 A1* | 5/2009 | Kim et al. | 257/315 |
| 2009/0173991 A1* | 7/2009 | Marsh et al. | 257/324 |
| 2009/0199898 A1 | 8/2009 | Do et al. | |
| 2009/0232901 A1* | 9/2009 | Walt et al. | 424/501 |
| 2009/0269558 A1* | 10/2009 | Himmelhaus et al. | 428/195.1 |
| 2009/0274873 A1 | 11/2009 | Shinotsuka | |
| 2010/0080954 A1* | 4/2010 | Mohseni | 428/131 |
| 2010/0175749 A1* | 7/2010 | Tsutsumi et al. | 136/256 |
| 2010/0178417 A1* | 7/2010 | Connor et al. | 427/74 |
| 2010/0276747 A1* | 11/2010 | Lee et al. | 257/325 |
| 2012/0225517 A1* | 9/2012 | Zhang et al. | 438/71 |

OTHER PUBLICATIONS

Chen et al., Using colloidal lithography to fabricate and optimize sub-wavelength pyramidal and honeycomb structures in solar cells, Optics Express, vol. 15, No. 22, 2007, pp. 14793-14803.*

Zhang et al., Advances in Contemporary Nanosphere Lithographic Techniques, Journal of Nanoscience and Nanotechnology, vol. 6, 2006, pp. 1-15.*

Kandulski, Shadow Nanosphere Lithography, 2007, pp. 1-81.*

Tsai et al., Patterned Glass Substrates for Enhanced Solar Energy Harvesting in Thin Film Solar Cells, IEEE, 2011, pp. 945-947.*

Inns et al., Wafer Surface Charge Reversal as a Method of Simplifying Nanosphere Lithography for Reactive Ion Etch Texturing of Solar Cells, Advances in OptoElectronics, 2007, pp. 1-5.*

Cheung et al., Fabrication of nanopillars by nanosphere lithography, Nanotechnology, vol. 17, No. 5, 2006, pp. 1339-1343.*

Tan et al., Fabrication of Size-Tunable Gold Nanoparticles Array with Nanosphere Lithography, Reactive Ion Etching, and Thermal Annealing, J. Phys. Chem. B, 109, 2005, pp. 11100-11109.*

U.S. Appl. No. 61/122,169, entitled "Particle Reflow Etching", filed Dec. 12, 2008.

Danner, AJ et al., *Fabrication of Efficient Light-Emitting Diodes with a Self-Assembled Photonic Crystal Array of Polystyrene Nanoparticles*, IEEE Photonics Technology Letters, vol. 19, No. 1, Jan. 1, 2008, pp. 48-50.

Kim, BJ et al., *Inductively Coupled Plasma Etching of Nano-Patterned Sapphire for Flip-Chip GaN Light Emitting Diode Applications*, Thin Solid Films, vol. 516, No. 21, Sep. 1, 2008, pp. 7744-7747.

Kosiorek, A et al., *Fabrication of Nanoscale Rings, Dots, and Rods by Combining Shadow Nanosphere Lithography and Annealed Polystyrene Nanosphere Masks*, Small Wiley-VCH Germany, vol. 1, No. 4, Apr. 2005, pp. 439-444.

International Application No. PCT/US2010/05572 Search Report dated Jan. 16, 2012.

International Application No. PCT/US2010/05572 Written Opinion dated May 25, 2012.

* cited by examiner

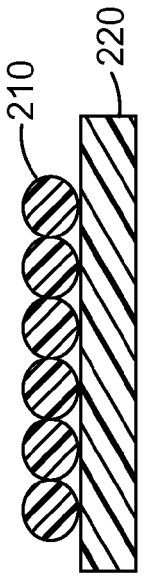
Fig. 3A
Fig. 3B
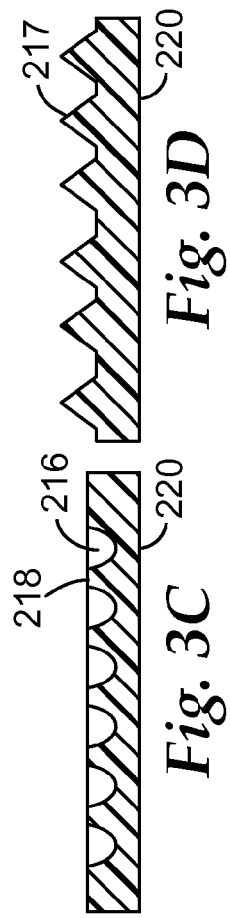
Fig. 3C
Fig. 3D
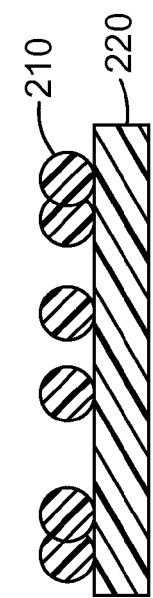
Fig. 2A
Fig. 2B
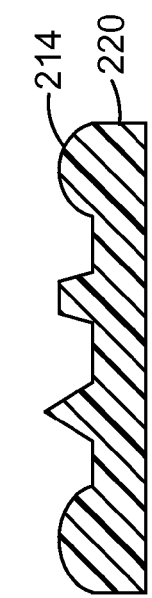
Fig. 2C

TEXTURING SURFACE OF LIGHT-ABSORBING SUBSTRATE

CROSS REFERENCE TO RELATED APPLICATIONS

This application is a national stage filing under 35 U.S.C. 371 of PCT/US2010/055772, filed on Nov. 8, 2010, which claims priority to U.S. Provisional Application No. 61/261,875, filed on Nov. 17, 2009, the disclosure of which is incorporated by reference in its/their entirety herein.

FIELD OF THE INVENTION

The present invention relates to etched substrates and processes for making etched substrates. The present invention also relates to solar cells incorporating such substrates.

BACKGROUND

Solar cells are increasingly becoming a more desirable form of energy production. A solar cell operates by converting absorbed photons into electrical current. Therefore, in order to operate at maximum efficiency, a solar cell should absorb as many useful photons as possible. However, for commonly used single-crystalline solar cells, more than 35% of the light incident on the cells is reflected from the surface. In an effort to combat the reflective effects of solar cells, manufacturers have developed various antireflection coatings (ARCs), such as quarter-wavelength silicon nitride ($Si_3N_4$) thin films deposited by plasma-enhanced chemical vapor deposition. However, it has been discovered that commercial $Si_3N_4$ ARCs are highly wavelength dependent, and when they are designed to exhibit low reflectivity at wavelengths around 600 nm, the reflectivity increases to more than 10% for other relevant wavelengths.

Due to the shortcomings of ARCs, surface texturing of solar cells has been offered as an attractive alternative approach to reduce reflectivity across a broader wavelength range. The effect of such texturing is to control the direction of the light within the solar cell substrate to maximize the propagation distance within the substrate, thereby maximizing the absorption. Efforts to improve light collection capabilities of photovoltaic devices, by adopting the efficient texturing designs have greatly increased. Most surface texturing has thus far been accomplished by photolithographic patterning followed by wet etching. Fabrication of small (sub-wavelength) features requires resist patterned by e-beam lithography or interference lithography, which are expensive processes and not readily scalable to large area for low-cost, high-volume manufacturing.

It would therefore be desirable to have a method of texturing the surface of light-absorptive substrates that was more efficient, lower cost, and easily scalable for high-volume manufacturing.

SUMMARY

In one aspect, the present description relates to a method of texturing a substrate. The method includes the steps of coating a layer of particles on a top surface of the substrate, modifying the particles, and etching the substrate using the modified particles as an etch mask.

In another aspect, the present invention relates to a different method of texturing a substrate. The method includes the steps of coating a layer of particles on a top surface of the substrate and coating over the layer of particles with a high index layer.

BRIEF DESCRIPTION OF THE DRAWINGS

FIG. 2A-C is a schematic diagram of an exemplary substrate etching process.

FIG. 3A-D is a schematic diagram of exemplary substrate reflow etching processes.

DETAILED DESCRIPTION

The present description relates to textured substrates and processes for making textured substrates. In particular embodiments, the methods and articles described herein may be particularly useful for preparing roughened surfaces for light absorptive substrates, such as solar cells. The methods and articles described herein are useful, however, for any situation in which a roughened surface is desired. In relation to photovoltaic solar cells production, the present description provides a means of reducing cost and improving both manufacturing and performance efficiency for solar cells.

Figure 1:
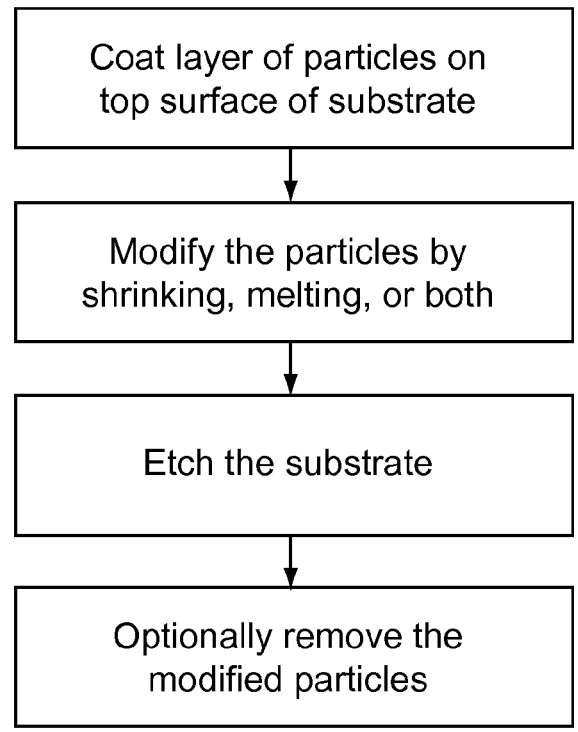
FIG. 1 is a flow chart representing an exemplary substrate etching process.

In one aspect, the present description relates to a method of texturing a substrate including the steps of coating a layer of particles on a top surface of the substrate, modifying the particles, and etching the substrate using the modified particles as an etch mask. FIG. 1 provides a flow chart of an exemplary substrate etching process that includes the above steps as well as other optional steps. It is to be understood that the process may be carried out sequentially, but may also be performed in another sequence.

Modifying the particles may generally include melting or "reflowing" of the particles. Melting (reflowing) is performed to increase the area of contact between at least some of the particles and the substrate. Furthermore, reflowing improves the adhesion between the two which can reduce or prevent undercutting (of the etch mask) during the etching.

Figure 4:
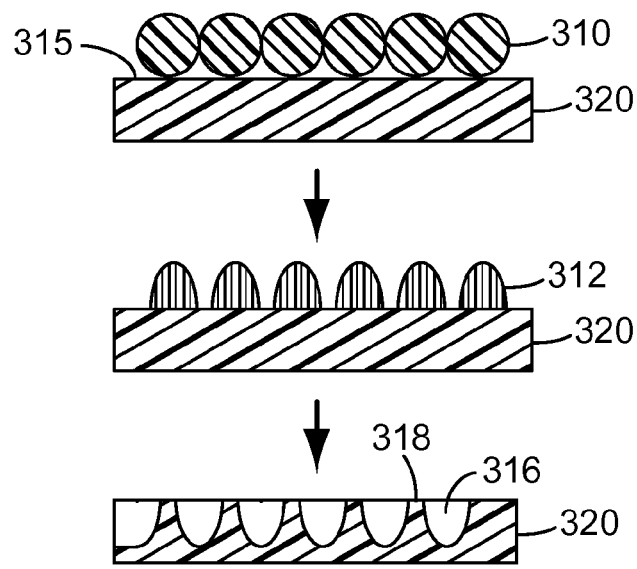
FIG. 4 is a schematic diagram of an exemplary reflow etching process.

The first step in the exemplary process, as shown in FIG. 1 and FIG. 4, is coating a layer of particles 310 on a top surface 315 of a chosen substrate 320. The layer of particles 310 may contain any particle materials capable of being melted and serving as an etch mask. For instance, the particles may be silica, low-melting temperature inorganic glass, metal (such as gold, silver, zinc, indium, tin, lead, bismuth, or cadmium), polystyrene, polymethyl(methacrylate) or any thermoplastic polymer, or combinations thereof. Polymeric particles may be, for instance, a polystyrene co-polymer comprising amino groups, a polymethyl(methacrylate) copolymer comprising hydroxyl groups, an epoxy-type polymer, an aldehyde-type polymer, a methyl chloride-type polymer, or a carboxylic acid and/or amino group containing polymer (e.g., an amino acid-type polymer).

One of skill in the art, in light of the present description, will understand that choosing an appropriate particle may be guided, for instance, by considering the appropriate size and/or size range, adhesive properties, thermal properties, wetting, and etch rates of potential particles. In some embodiments, the particle size is selected to correspond to the depth of desired etched features.

Further, consideration should be given to the adhesion of particles to the substrate. This will be affected by charge on the particles (if any), as well as any surface functionalization (if present) applied to the particles and/or the substrate.

Another consideration in selecting a proper particle and substrate combination is the ease of modifying the particles. For instance, in the case where the modification of the particles consists of melting them, the time and temperature required to reflow the particles must be compared to time and temperature exposure that would damage the substrate. The particles should reflow at a temperature that preferably does not lead to melting or distorting the substrate. Further, the particles should reflow at a temperature that avoids heating the substrate above any temperature that would damage any device structures that have previously been fabricated on the substrate. These temperature considerations tend to drive the particle materials choice towards thermoplastic polymers, low-melting-temperature glass, or low melting point metals. Exemplary metals include gold, silver, zinc, indium, tin, lead, bismuth, or cadmium. Thermoplastic polymers may also be used, as they allow for reflow without damaging many substrate materials, which cannot tolerate temperatures higher than a 200-300° C. Dispersions of masking particles may optionally also have smaller inorganic particles added; these can be used to control the dispersion of the larger particles, wetting, or the etch rate.

Also to be considered when selecting a particle-substrate combination is the wetting of the substrate by the melted particle. In some embodiments, for the particles to make good mask layers for wet etching processes they must adhere well to the substrate. This may be influenced by the relative surface energies of the particle and substrate.

As a further consideration, one might take into account the etch rate of a particle relative to that of the substrate, during the etching step, via whatever process is being used (that is, etching selectivity). In order to etch sufficiently deep features, it may be desirable for the reflowed particles to etch much more slowly than the substrate.

Non-uniform features can be obtained by using a distribution of particle sizes, by relying on natural statistical variations in particle spacing (for sparse layers) or by relying on the fact that sparsely-coated (e.g., sub-monolayer) layers tend to show clumping which, after melting, would produce islands of variable size. Using different materials with different etch rates may also produce variable etching profiles, which may or may not be desirable.

The particles may be any size appropriate, taking into account, for instance, dispersion capabilities, surface identity, particle identity, the size of features desired, the etch method to be used, and the like. Particle sizes may range, for instance, from 50 nm to 10 µm. In general, the particles may be dispersed in a solvent capable of providing a relatively uniform coating of the particles on a substrate (unless non-uniform features are desired, in which case a different solvent system should be considered). For instance, when the particles are silica, the solvent may be selected from water or an appropriately solvating organic solution. Alternatively, when the particles are polystyrene, the solvent may be selected from an aliphatic alcohol, water, or a combination thereof. Further, when the particles are polymethyl(methacrylate), the solvent may be selected from an aliphatic alcohol, water, or a combination thereof.

Finally, the optical properties of the particles may be taken into account. Specifically, in certain embodiments, particles may not be etched completely away and may remain adhered to the substrate. In some cases a separate layer may also be coated over the remaining particles. This will be discussed further below. In embodiments where the particles remain on the substrate, the transparency or opaqueness of the particles may be taken into account. Further the index of refraction and any absorptive or reflective properties may be taken into account such that the particle serves a suitable purpose.

The substrate described herein may be any substrate capable of being etched. In at least some embodiments, the substrate is light absorbing. In particular, the substrate may be used for the purpose of a semiconductor solar cell. As such, the substrate may be a semiconducting material forming the solar cell, or a transparent optical glass such as silica or borosilicate, that will form a window above the semiconductor solar cells. Because of the potential desirability of the substrate acting as a photovoltaic solar cell, it may be particularly useful for the substrate to be formed from a crystalline material. Examples of especially desirable crystalline materials include silicon, gallium arsenide, copper indium diselenide, or cadmium telluride. Any other suitable solar cell materials are also contemplated for use as a substrate.

Figure 9:
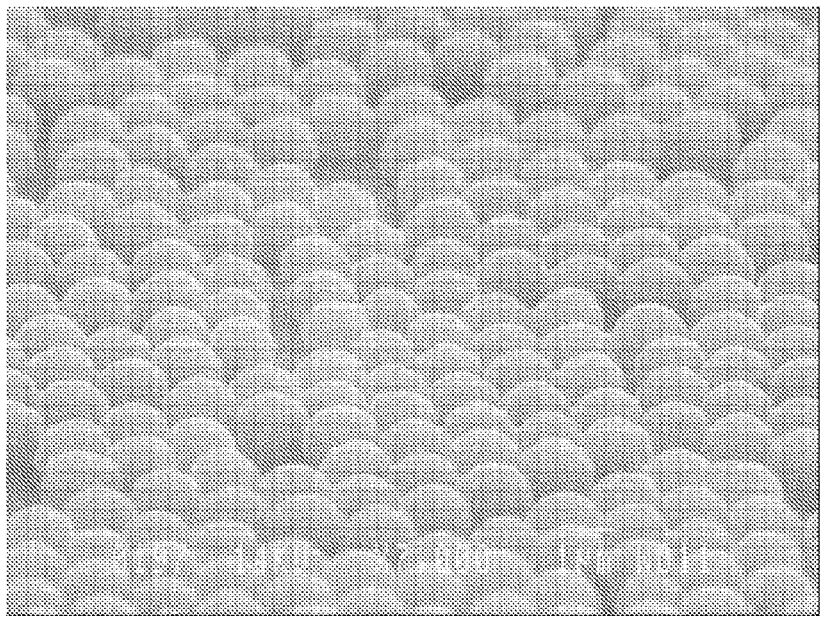
FIG. 9 is a SEM image of "close-packed" melted particles.

The particles described herein may be coated by any method capable of applying a layer of particles on the surface of the substrate. In some embodiments, such coating methods provide a substantially mono-layer of particles, that is, a layer which is essentially free of regions having more than one layer of particles. The mono-layer may be close-packed, where the space between the particles is minimized. For spherical particles of identically the same diameter, the projection of close packed particles onto the substrate surface covers ~91% of the surface. However, for the case where the particle shape deviates from spherical, or where there is a distribution of particle sizes, the percentage coverage will vary. In some embodiments, the layer may cover at least 50% of the substrate surface. In other embodiments the layer may cover at least 60% of the substrate surface. In yet other embodiments, the layer may cover at least 70%, 80% or 90% of the substrate surface. As used herein, a "close-packed" monolayer may be understood as a layer that covers at least 70% of the substrate surface. A better understanding a "close-packed" monolayer is defined as may be achieved by reference to FIG. 9. This figure displays an SEM image of one contemplated embodiment of a layer of particles in the present description.

Suitable methods of coating the particles onto the substrate include, but are not limited to, dip coating, spin coating, bar coating, roll coating, knife coating, spray coating, vertical evaporation, convective assembly/deposition, Langmuir-Blodgett assembly, chemical or electrochemical coating, or electrostatically driven coating. When choosing a coating method, one of skill in the art will consider such factors as the size of the substrate (e.g., the surface area); whether the article is a flexible web, in particular if it is to be processed in a roll-to-roll continuous format; the coating uniformity required; and the nature of the solvent used to suspend the particles.

In some cases, the coating solution may include a surfactant for purposes of dispersion. In other words, the particles are part of a solution that is ultimately coated onto the substrate, and a surfactant may be added to properly disperse the particles. Surfactants may be selected based upon their dispersing ability in the solvent, the surface properties of the particles, the temperatures to which they will be exposed, the ability of a surfactant to be removed from a surface (by rinsing, etching, or some other method), and the chemical and thermal stability of the surfactant.

Some commonly encountered surfactants of each type include (a) ionic (i) anionic (e.g., based on sulfate, sulfonate, or coboxylate anions): perfluorooctanoate (so-called PFOA, or PFO), perfluorooctanesulfonate (so-called PFOS), sodium dodecyl sulfate (so-called SDS), ammonium lauryl sulfate (and other alkyl sulfate salts), sodium laureth sulfate (also known as sodium lauryl ether sulfate (SLES)), alkyl benzene sulfonate, and, generally, soaps or fatty acid salts; (ii) cationic (e.g., based on quaternary ammonium cations): cetyl trimethylammonium bromide (so-called CTAB, a.k.a. hexadecyl trimethyl ammonium bromide), and other alkyltrimethylammonium salts, cetylpyridinium chloride (so-called CPC), polyethoxylated tallow amine (so-called POEA), benzalkonium chloride (so-called BAC), and benzethonium chloride (so-called BZT); and (iii) Zwitterionic (also known as amphoteric): dodecyl betaine, cocamidopropyl betaine, and Coco ampho glycinate; (b) nonionic: alkyl poly(ethylene oxide), alkylphenol poly(ethylene oxide), copolymers of poly (ethylene oxide) and poly(propylene oxide) (commercially known as poloxamers or poloxamines), alkyl polyglucosides (including, for instance, octyl glucoside and decyl maltoside), fatty alcohols (including, for instance, cetyl alcohol and oleyl alcohol), cocamide MEA, cocamide DEA polysorbates (such as those known as Tween 20 and Tween 80. and dodecyl dimethylamine oxide. One skilled in the art will recognize that this is in no way intended to be a comprehensive list of available surfactants but is meant only to provide guidance as to the factors one should consider in selecting an appropriate surfactant for use in dispersions as described herein.

Returning to FIG. 1 and FIG. 4, after coating the substrate with particles, the next step is to modify the particles 310 resulting in particles 312. The modification of the particles may include the steps of melting the particles (or "reflowing" the particles), shrinking the particles, or both. A better understanding of this step is shown in FIGS. 2A and 2B. The step from FIG. 2A to 2B illustrates melting the particles 210 onto the substrate 220 such that some of the melted particles coalesce, and coating elements 212 are created with increased contact area and improved adhesion.

When melting the particles, one of skill in the art will understand that the particles should be heated, for instance, above their melting point, or sufficiently above their glass transition temperature (i.e., Tg) such that they reflow during the allotted process time, but without undesirable decomposition, evaporation, or reaction with the substrate. Of course, when melting takes place, for instance, in an oven, care should be taken to choose a particle that can be melted at a temperature that does not damage or decompose the substrate, or any other material that is heated at the same time. Techniques potentially useful for melting the particles while imparting a minimum heating to the substrate include infrared radiant heating, flash heating, or exposure to optical radiation (e.g., from a laser) of a wavelength strongly absorbed by the particles but not the substrate.

Alternatively, the particles may be modified by being "shrunk" either instead of, before, after, or contemporaneously with melting the particles. The shrinking step can involve reactive-ion-etching or oxygen plasma etching the particle layer. Oxygen plasma etching produces energized radicals and ions at the surface of the substrate capable of etching equally from all angles (isotropically). The process generally can be employed at fairly high pressures (e.g. from 0.1 Torr to 1.0 Torr). The process of reactive-ion-etching is a comparable process to oxygen plasma etching except that the etching occurs at lower pressures (e.g. from 0.001 Torr to 0.1 Torr), thereby allowing for deeper etching features, and may include any number of other plasma chemistries. In either step, the particles are reduced in size from different angles. In other words, the height of the particles (from the substrate to the top of the particle) not only decreases, the side-to-side distance (or width) also decreases. The result is that the shrunken particles do not cover as much surface area of the substrate. The reactive-ion-etching or oxygen plasma etching step may also be performed under such conditions that the particles contemporaneously melt to the substrate top surface while being shrunk. Alternatively, the particles may be first modified by being shrunk, followed by a second modification of melting. Conversely, the particles may be melted before being shrunk. If the shrinking step alone is performed, more surface area of the substrate top surface will be left uncovered (or unmasked). This may be desirable in certain applications. A shrinking step followed by a melting step may leave more surface area unmasked than a melting step alone, depending on how much the particles spread and wet the substrate surface during the melt. It is also important to note that if the particles of uniform size form a close-packed pattern on the substrate, and then the particles are shrunk so they no longer are in contact, the periodicity and fill factor (ratio of feature size to spacing) of the pattern may be controlled independently.

After modification of the particles, the next step, as illustrated in FIG. 1 and FIG. 4, is etching the substrate using the modified particles as an etch mask resulting in depressions between the masked regions. In selecting an appropriate etching technique, one should consider the etch rate ratio between the particles and the substrate, the degree of etching anisotropy required (that is, the aspect ratio of the desired structure), and the potential for damage to the substrate during the process. Depending on the identity of the particle and the substrate, appropriate etching techniques may include dry etching, wet etching, or a combination of the two. Wet etching techniques may be most appropriate for etching structures into solar cell substrates given the cost and simplicity of such processes in manufacturing. Wet etching may be accomplished, for instance, by immersion in well-known acidic or basic etchants, or solvents. Dry etching and wet etching may be used in combination with one another in certain embodiments. Appropriate dry etching methods may include sputter etching, reactive ion etching or ion beam etching, amongst others. This may be particularly desirable where the goal is to create structures in the substrate with high aspect ratios.

The major advantages of modifying the particles include both a greater adherence to the substrate, as well as the ability to cover more surface of the substrate (without as many gaps), or to independently set the size and spacing of the masking elements. Without the modification of the particles, wet etchants typically penetrate under the particles and degrade the ability of the particles to mask the substrate effectively. This may be understood by reference to FIGS. 3A and 3B. As a general comment, it should be understood that FIG. 3A-3D shows the process as accomplished in two manners. The first involves the steps in FIGS. 3A, 3B and then 3C. The second involves the steps in FIGS. 3A, 3B and then 3D. The final step in both processes will be explained further below. FIG. 3A illustrates the particles 210 before any melting/reflow. It is noted that there exists a good deal of surface area on the substrate 220 that is under the particles, but is not in contact with the particles 210. This surface area may be easily penetrated by etchant, which is undesirable in many circumstances. For example, while the substrate area immediately below the contact points with particles 210 would be masked, a great deal of etchant would freely contact the substrate and etch most of the surface. In contrast, FIG. 3B illustrates the effect that melting the particles into melted particles 212 has. It is easily seen that a great deal more of the surface area is "masked" resulting in more effective masking for the etching process. This is the greatest benefit of the melting process.

When the surface of a substrate is etched, surface features are provided. Such surface features can be any appropriate shape for a roughened surface. When an anisotropic etchant is used, generally, the etching will occur in the substrate according to the material structure of the substrate. For instance, in a crystalline material, such as silicon, an anisotropic wet etchant will generally etch at a greater rate along one of the crystalline planes. This generally results in the formation of prism structures. This effect may be better understood by reference to FIGS. 3B and 3D. In this case, despite the fact that the melted particles have a rounded shape, the etchant etches through substrate 220 according to the crystalline structure. Therefore, prismatic surface features 217 are created. Isotropic etching results in etching occurring at a comparable rate in all directions. Therefore, the shape etched into the structure will depend largely on the mask of particles that is present on the substrate surface. This effect is shown in the transition from FIG. 3B to FIG. 3C. Here concave recessions 216 are etched into the substrate 220 with structures 218 remaining below where the most mask 212 was previously located.

Any number of etched substrate structures are contemplated. For example, surface structures or features may be conical, pyramidal, prismatic, hemispheric, cylindrical, truncated versions of the above, and also any other sort of randomly shaped microstructure. Further, the etching may occur such that the main structures created are actually large holes into the substrate with micropeaks dispersed throughout the substrate between the holes.

FIGS. 2A-2C, 3A, B&C and 3A, B&D show the process as performed in three different manners. FIG. 2A-2C displays a schematic flow chart of a first process. Here, the monolayer of particles 210 is layered onto the substrate 220 such that the particles are spaced apart. Upon melting the particles into melted particle 212, the distribution of the particles results in various sized and distributed melted particles 212. As can be seen from the FIGS. 2B and 3B, the melted particles widen at the base such that more surface area of the substrate 220 is covered. After modification, wet etching is performed with the different shaped melted particles 212 used as a mask. The result is a variety of differently shaped structures 214. These shapes may be described as random and based upon how the particles disperse on the substrate 220.

Alternatively, the layer of particles 210 may be closely packed as shown in the schematic diagram for FIGS. 3A-3D. Here, melting the particles results in a tightly packed distribution of melted particles 212, such that there is very little surface area of the substrate 220 that is not covered by the particles 212. The manner of etching may then determine the sort of structures created on the substrate 220. In FIG. 3C the substrate is isotropically etched resulting in rounded concave depressions 216. Between the depressions are microstructures 218. FIG. 3D illustrates the result of an anisotropic etch, such that the structures 217 are formed according to the crystalline structure of substrate 220.

A process that utilizes reactive-ion-etching or oxygen plasma etching to shrink the particles is illustrated in the schematic diagram of FIG. 4. Here the particles 310 are distributed in a closely packed manner in the layer on the substrate 320 (much as in FIG. 2(B-C)). However, in this case, the particles are both melted and etched. This results in the particles 312 being shrunk such that there is more distance between neighboring melted particles. As a result, when the substrate etching step is performed, a great deal more etchant is in contact with the substrate 320 and recessions 316 are formed into the substrate. The major structure formed is the recession 316 with micropeaks 318 located between the recessions at the position where the most particle etch mask 312 was present. The final product of the process in FIG. 4 may be noted as being similar to that in FIG. 3C. The difference primarily is that when the particles 310 are shrunk into modified particles 312, they mask less surface area. This will results in wider depressions 316 and more narrow micropeaks 318 between the depressions. Any of the processes from FIG. 2A through FIG. 4 may be effective at reducing reflection at the light absorbing substrate surface.

Returning to FIG. 1, once the substrate has been etched, the modified particles may optionally be removed. As the particles serve as an etch mask, the etching will generally result in at least some, if not all, of the particle layer being removed through the etching process. However, some of the particle layer may remain. The particle layer may have anti-reflective properties or other desirable properties that would create a desire to leave the particle layer adhered to the substrate for its ultimate use. However, in many embodiments, it will be desirable that remaining particles are removed. Removal of the particles may occur through any number of known processes in the art. For example, the particles may be removed mechanically, by solvent, by further etching, by physical vibration, or any other number of methods.

Figure 10A:
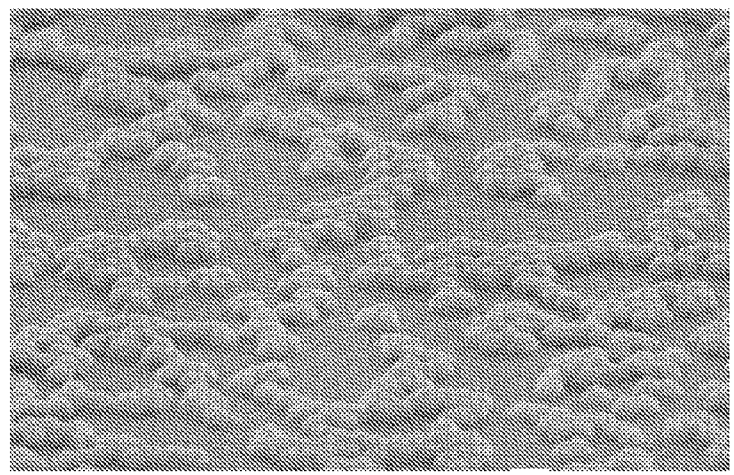
FIG. 10A-C are SEM images of particles coated with a high-index layer.
Figure 10B:
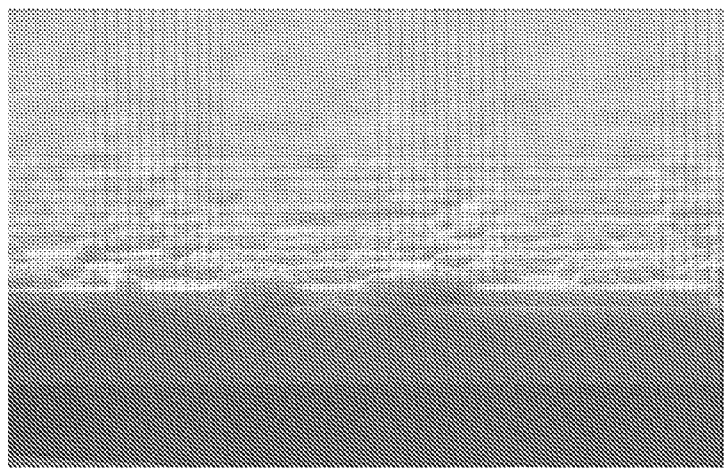
Figure 10C:
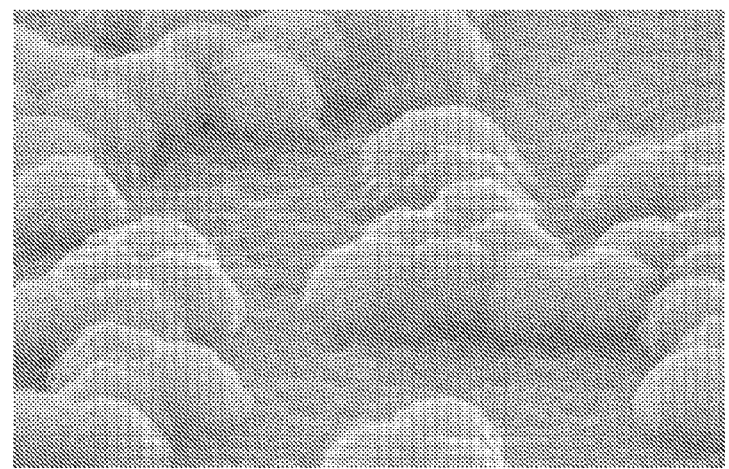

In another embodiment, it has been found that one alternative manner of lowering the reflectivity of the light absorbing substrate involves depositing the layer of particles onto the substrate, and potentially modifying the particles, but not etching. In this embodiment, after the particles are added and potentially modified by shrinking and/or melting, the layer is covered by another high-index of refraction layer of material. The high-index material used for coating may be any number of suitable materials. Particularly useful materials include Si3N4, ZnS, ZnSe, TiO2, ZrO2, Al2O3, HfO2, Ta2O5, and SiON. FIG. 10A-C illustrates one example of such an embodiment. In this figure, 440 nm SiO$_2$ nanoparticles are coated onto the substrate. No melting occurs. After the nanoparticles are deposited, the entire surface (of both the substrate and nanoparticles) is coated with a 400 nm layer of ZnS by vacuum evaporation from a baffled boat. The layer may be of any appropriate thickness, but may be chosen according to the most suitable thickness for heightened light absorption. Further, the high-index of refraction layer may be deposited by an appropriate method, such as e-beam evaporation, sputtering, physical vapor deposition, plasma enhanced chemical vapor deposition, chemical vapor deposition, spin-on coating, or any other number of methods. If modification of the particles is desired in this particular process, it again may occur through melting, reactive-ion etching or oxygen plasma etching, or both the melting and etching processes.

EXAMPLES

Some of the advantages of the disclosed constructions are further illustrated by the following examples. The particular materials, amounts, and dimensions recited in these examples, as well as other conditions and details, should not be construed to unduly limit the present invention.

Example 1

Figure 5:
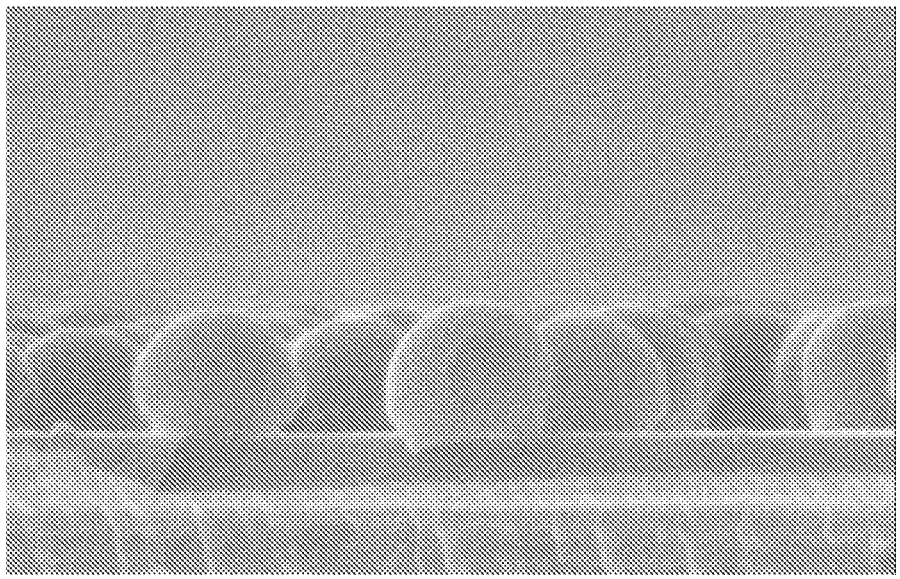
FIG. 5 is an SEM image of particles coated on an Si substrate by dip-coating.

A powder of spherical polymethyl(methacrylate) (PMMA) particles with nominal diameter of 0.8 µm (available from Soken Chemical & Engineering Co., Ltd) was dispersed in water to produce suspensions have 12 wt. % by solids content. To aid dispersion, 0.01% tomadol 25-9 nonionic surfactant (available from Air Product and Chemicals, Inc.) was added to the solution. The particle solution was coated on a (100 oriented) silicon wafer substrate by dip coating with a coating speed of 65 mm/min. The coated substrate was then heated at 130° C. for 1 minute on a hotplate to reflow the particles. FIG. 5 provides SEM images of the melted particles coated on the Si showing increased contact area.

Figure 6:
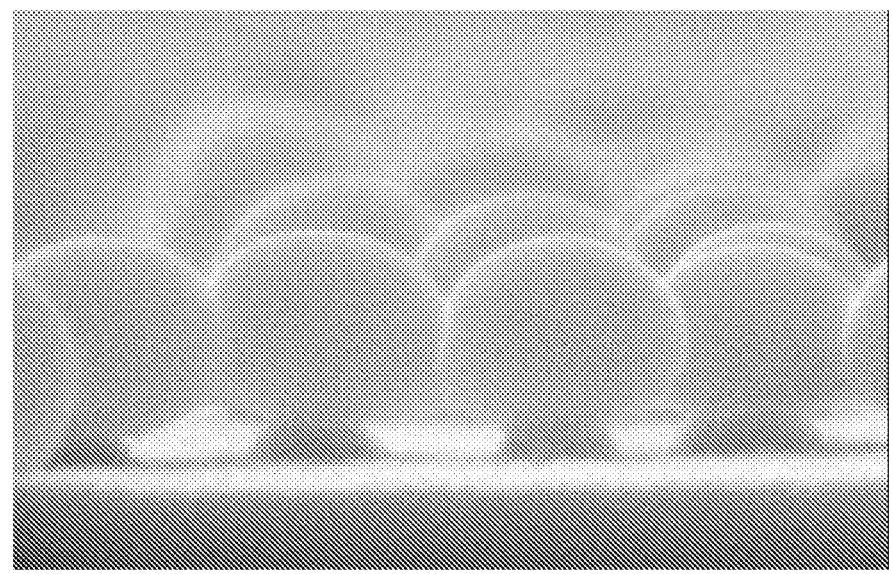
FIG. 6 is a SEM images of etched substrate using melted particles as an etch mask in an etching solution.

The Si wafer was next isotropically wet-etched. This was performed by immersing the coated Si wafer with the PMMA mask into $HNO_3$:$12H_2O$:$NH_4F$ (25:12:1) solution for 3 hours at room temperature without agitation. FIG. 6 shows SEM images of the etched Si with the melted PMMA still in place. The etching depth into the Si was approximately 300 nm.

Example 2

Figure 7A:
FIGS. 7A-D are SEM images of structures etched using melted particles as an etch mask in an etching solution for various etch times.
Figure 7B:
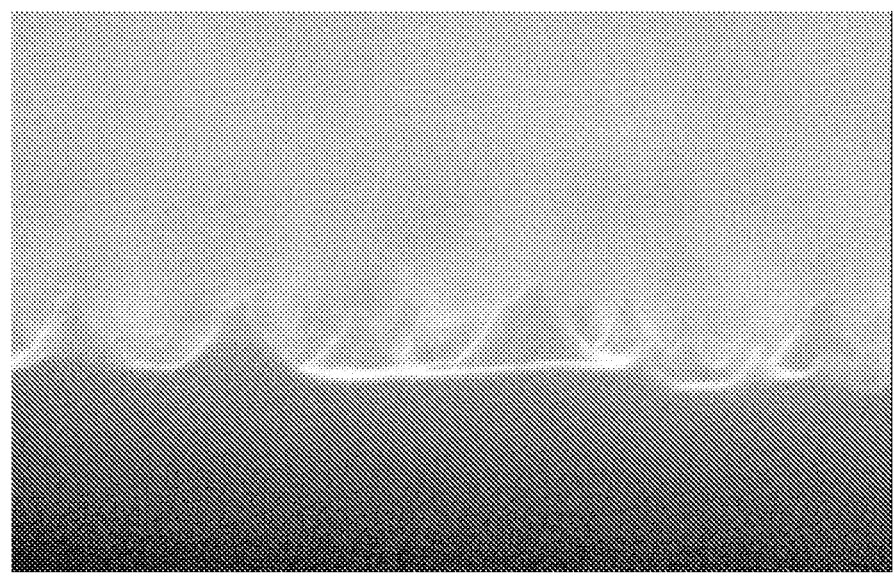
Figure 7C:
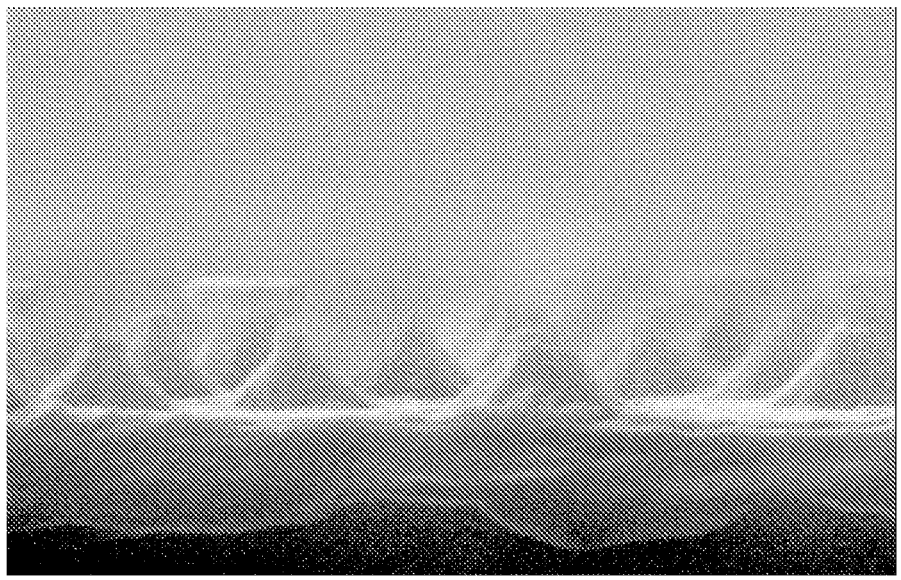
Figure 7D:
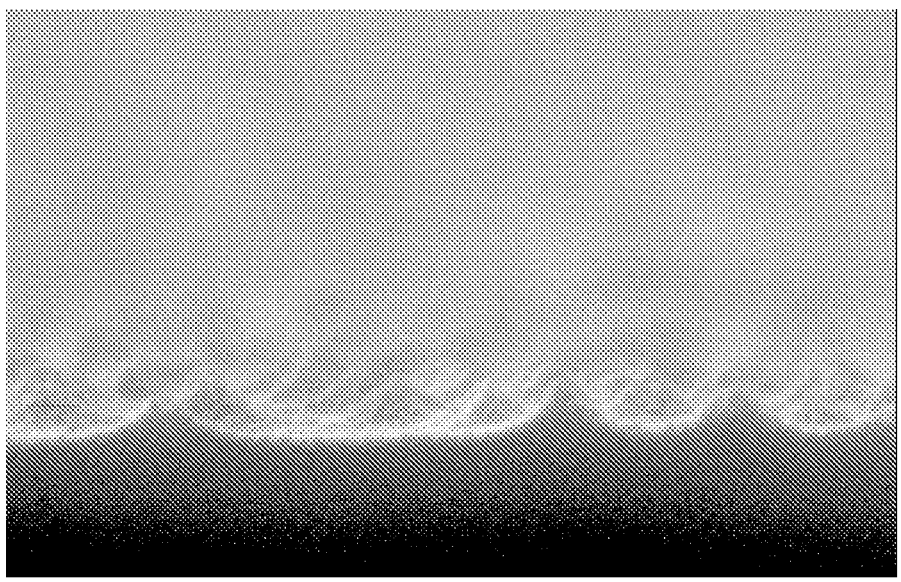

A similar process was used as in Example 1, except that a number of different samples were immersed into the $HNO_3$: $12H_2O$:$NH_4F$ (25:4:1) wet etchant for different times. Further, after the wet etching, the samples were sonicated in an isopropanol solution for 5 minutes in order to remove the residual PMMA particles. FIGS. 7A-D displays the results for etch times of 5 minutes (FIG. 7A), 8 minutes (FIG. 7B), 10 minutes (FIG. 7C), and 13 minutes (FIG. 7D). Pyramidal structures were achieved in spite of the isotropic nature of the wet etchant. Hence, use of an isotropic etchant can result in asymmetric structures, indicating that the process described herein is not limited to single-crystalline silicon, but may also be applied to amorphous silicon, polycrystalline silicon, and potentially other solar cells.

Figure 8:
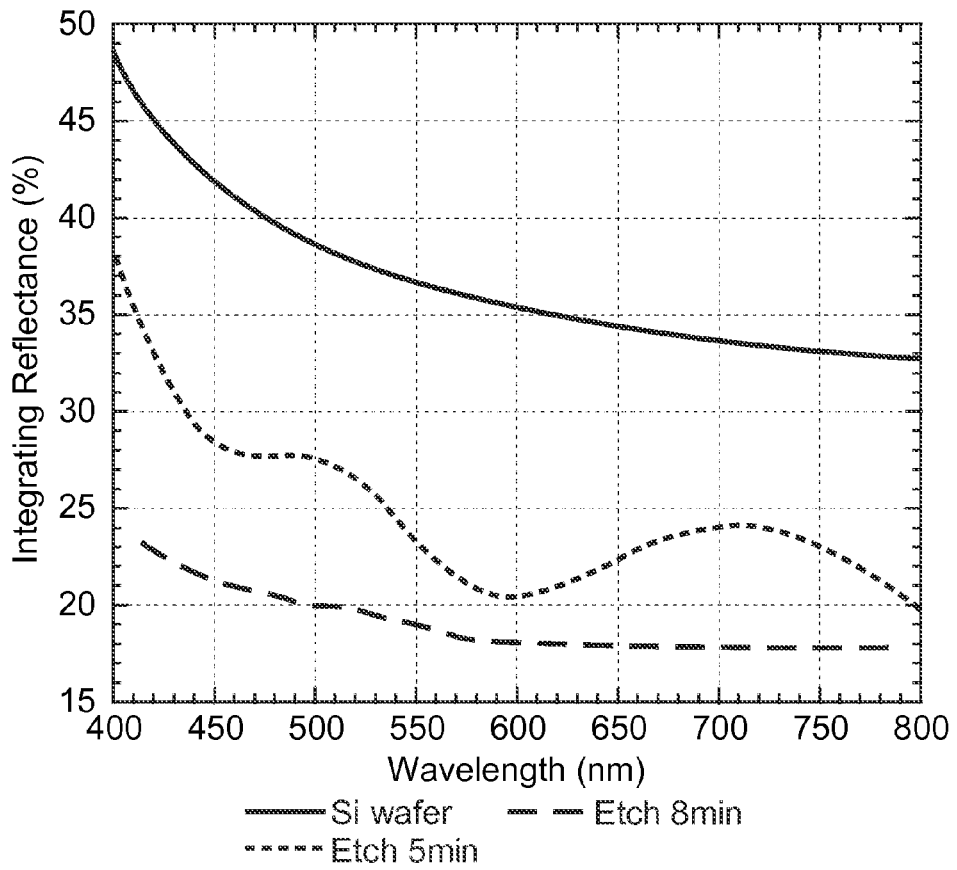
FIG. 8 displays reflection spectra of several structures etched using melted particles as an etch mask for various etch times.

Reflection spectra for etched substrates created by the above process (5 minute and 8 minute etch times.) as well as a reflectance spectrum for a silicon wafer with no structures or coating were measured. The total diffuse reflectances of the samples (capturing both spectral reflections and scattered light) were measured by UV-VIS spectrometry (PerkinElmer Ltd., UK). FIG. 8 displays the results. The graph provides the reflection spectra of the structures etched for the designated times using melted 0.8 µm PMMA particles as etch masks. An etching time of 8 minutes showed the best antireflective properties over the visible spectrum of light compared with the other etch time and unetched wafer. The diffuse reflectance of the 8-minute etched sample ranged from 24% at 400 nm wavelength, to 18% at 800 nm. In stark contrast, the silicon wafer with no etching performed had very high reflectivity, ranging from approximately 48% to approximately 33% over the same wavelength range.

What is claimed is:

1. A method of texturing a substrate comprising the steps of:
    a) coating a layer of particles on a top surface of the substrate;
    b) modifying the particles comprising melting the particles to form melted particles that are randomly sized and distributed; and
    c) etching the substrate using the modified particles as an etch mask to form randomly-shaped structures.

2. The method of claim 1, wherein modifying the particles increases an area of contact between at least some of the particles and some of the substrate.

3. The method of claim 1, wherein the step of modifying the particles further comprises shrinking the particles through reactive-ion-etching or oxygen plasma etching.

4. The method of claim 1, wherein the step of modifying the particles comprises both shrinking the particles and melting the particles, and shrinking the particles occurs before melting the particles.

5. The method of claim 1, further comprising removing the modified particles after etching the substrate.

6. The method of claim 1, wherein the particles are comprised of polymethyl(methacrylate).

7. The method of claim 1, wherein the layer of particles are dispersed in a solution before coating on the substrate, and a surfactant is added to the solution in which the particles are dispersed.

8. The method of claim 1, wherein the step of coating comprises one or more of spin coating, dip coating, bar coating, roll coating, knife coating, and spray coating.

9. The method of claim 1, wherein the substrate is a semiconductor solar sell.

10. The method of claim 9, wherein the semiconductor solar cell is comprised of silicon, gallium arsenide, copper indium diselenide, or cadmium telluride.

11. The method of claim 1, wherein the substrate is comprised of glass.

12. The method of claim 1, wherein the etching comprises wet etching.

13. The method of claim 1, wherein the etching comprises dry etching.

14. The method of claim 13, wherein the dry etching comprises sputter etching, reactive ion etching, or ion beam etching.

15. The method of claim 1, wherein the steps are carried out sequentially.

16. A method of texturing a substrate comprising the steps of:
    a) coating a layer of particles on a top surface of the substrate, and modifying the layer of particles comprising melting the particles to form melted particles that are randomly sized and distributed;
    b) coating over the layer of particles with a high index of refraction layer to cover the layer of particles,
    wherein the material of the high index of refraction layer includes at least one of $Si_3N_4$, ZnS, ZnSe, $TiO_2$, $ZrO_2$, $Al_2O_3$, $HfO_2$, $Ta_2O_5$, and SiON.

17. The method of claim 16, wherein the step of modifying the layer of particles comprises melting, reactive-ion etching or oxygen plasma etching the particles.

18. The method of claim 1, wherein the particles at least partially remain on the top surface of the substrate after etching, and the particles form a particle layer having anti-reflective properties.

* * * * *